(12) United States Patent
Lee et al.

(10) Patent No.: US 8,241,512 B2
(45) Date of Patent: Aug. 14, 2012

(54) ION IMPLANTATION MASK FORMING METHOD

(75) Inventors: Yong-Woo Lee, Anyang-si (KR); Young-Mi Lee, Seoul (KR); Min-Chul Chae, Suwon-si (KR); Dae-Joung Kim, Suwon-si (KR); Jae-Seung Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 925 days.

(21) Appl. No.: 12/289,637

(22) Filed: Oct. 31, 2008

(65) Prior Publication Data
US 2009/0117744 A1 May 7, 2009

(30) Foreign Application Priority Data
Nov. 1, 2007 (KR) .................. 10-2007-0111067

(51) Int. Cl.
*B44C 1/22* (2006.01)
*C03C 15/00* (2006.01)
*C03C 25/68* (2006.01)
*C23F 1/00* (2006.01)

(52) U.S. Cl. ................... 216/47; 216/12; 216/41

(58) Field of Classification Search .......... 216/12, 216/41, 47
See application file for complete search history.

(56) References Cited

U.S. PATENT DOCUMENTS

| 5,343,047 A | 8/1994 | Ono et al. |
|---|---|---|
| 5,641,969 A | 6/1997 | Cooke et al. |
| 7,064,078 B2* | 6/2006 | Liu et al. .................. 438/717 |
| 2007/0148885 A1* | 6/2007 | Kim et al. .................. 438/299 |
| 2008/0160778 A1 | 7/2008 | Nam et al. |

FOREIGN PATENT DOCUMENTS

| JP | 9-129746 | 5/1997 |
|---|---|---|
| KR | 10-1997-0003453 | 1/1997 |
| KR | 10-0651578 B | 11/2006 |

* cited by examiner

*Primary Examiner* — Roberts Culbert
(74) *Attorney, Agent, or Firm* — Lee & Morse, P.C.

(57) ABSTRACT

A method of forming an ion implantation mask includes forming a field area on a semiconductor substrate, forming an amorphous carbon layer on the semiconductor substrate, forming a hard mask layer on the amorphous carbon layer, forming an etching mask pattern on the hard mask layer, and etching the hard mask layer and the amorphous carbon layer to expose the field area through the etching mask pattern, wherein etching the hard mask layer and the amorphous carbon layer forms a hard mask layer pattern and an amorphous carbon layer pattern.

11 Claims, 4 Drawing Sheets

ION IMPLANTATION MASK FORMING METHOD

BACKGROUND

1. Technical Field

Embodiments relate to an ion implantation mask forming method.

2. Description of the Related Art

Semiconductor devices are generally fabricated through sequential, selective, and repeated unit-processes performed on a semiconductor substrate, e.g., processes such as deposition, photolithography, etching, ion implantation, polishing, cleaning, drying, etc. The ion implantation process may be performed by colliding an ion beam, formed of specific ions, with a specific area of semiconductor wafer. The ion implantation process is advantageous, since the number of ions implanted into the specific area, a depth of implantation, etc., can be controlled as compared with a heat diffusion technology.

In a manufacturing process to form an ion implantation mask, a trench may be formed as a field area to isolate between separate devices on the semiconductor substrate. The trench may be filled with insulation material, e.g., and oxide, and the substrate having the oxide-filled trench may then be covered with a photoresist layer. The photoresist layer may then be patterned, e.g., using exposure and developing processes. The photoresist pattern may expose the field area so that ions can be implanted into an exposed field area of the semiconductor substrate. A photoresist pattern must be thick if it is to be used as an ion implantation mask in a high-energy ion implantation. However, such thick photoresist patterns have high aspect ratios, and suffer from pattern leaning and lifting effects. Accordingly, there is a need for advances in the field of ion implantation masks that enable the formation of high aspect ratio ion implantation masks.

SUMMARY

Embodiments are therefore directed to an ion implantation mask forming method, which substantially overcomes one or more of the problems due to the limitations and disadvantages of the related art.

It is therefore a feature of an embodiment to provide an ion implantation mask forming method suitable for high aspect ratio patterns.

It is therefore another feature of an embodiment to provide an ion implantation mask forming method suitable for high-energy ion implantation.

At least one of the above and other features and advantages may be realized by providing a method of forming an ion implantation mask, the method including forming a field area on a semiconductor substrate, forming an amorphous carbon layer on the semiconductor substrate, forming a hard mask layer on the amorphous carbon layer, forming an etching mask pattern on the hard mask layer, and etching the hard mask layer and the amorphous carbon layer to expose the field area through the etching mask pattern, wherein etching the hard mask layer and the amorphous carbon layer forms a hard mask layer pattern and an amorphous carbon layer pattern.

The method may further include performing an ion implantation into the exposed field area using the hard mask layer pattern and the amorphous carbon layer pattern as an ion implantation mask. The method may further include, after performing the ion implantation, forming an organic layer in voids in the hard mask layer pattern and the amorphous carbon layer pattern. The method may further include removing a portion of the organic layer from a void in the hard mask layer pattern, after removing the portion of the organic layer, removing at least a portion of the hard mask layer, and, after removing at least a portion of the hard mask layer, exposing the field area by removing the organic layer from voids in the amorphous carbon layer pattern and/or amorphous carbon layer pattern.

The organic layer may be a photoresist layer. The organic layer may have thickness equal to or greater than a combined thickness of the amorphous carbon layer pattern and the hard mask layer pattern. Etching the hard mask layer and the amorphous carbon layer to expose the field area may include performing a first etch process to remove portions of the amorphous carbon layer to form the amorphous carbon layer pattern, and the first etch process may include using the hard mask layer pattern as an etch mask. At least one of $O_2$, Ar, $N_2$, and HBr may be used as an etching gas to remove the portions of the amorphous carbon layer. The hard mask layer may include one or more of SiON, SiN, or $SiO_2$.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
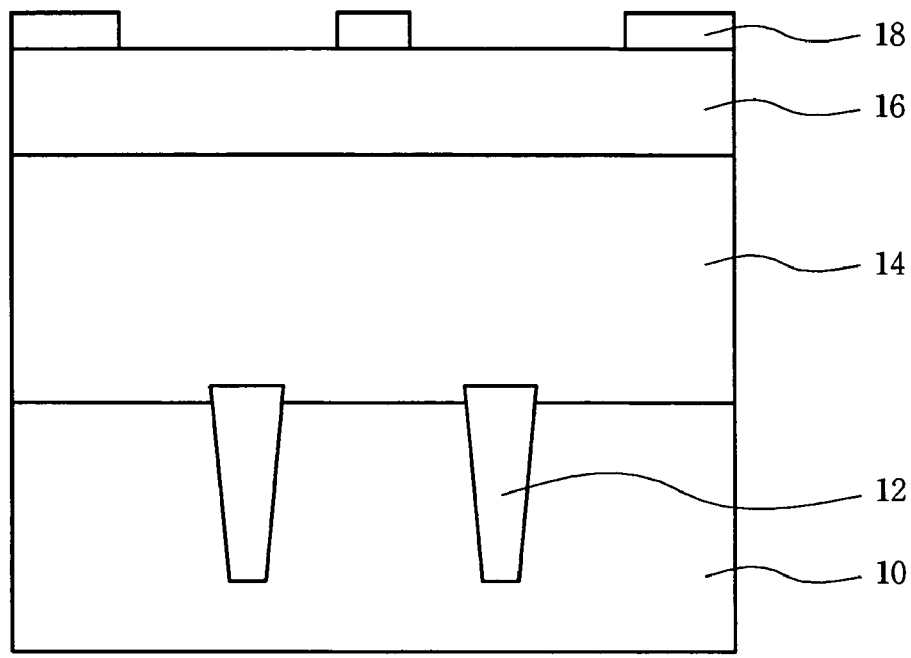
FIGS. 1 through 7 illustrate sectional views of stages in a method of forming an ion implantation mask according to an embodiment.

Korean Patent Application No. 10-2007-0111067, filed on Nov. 1, 2007, in the Korean Intellectual Property Office, and entitled: "Ion Implantation Mask and Mask Forming Method," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. For purposes of clarity, details of well-known functions or configurations have been omitted.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

FIGS. 1 through 7 illustrate sectional views of stages in a method of forming an ion implantation mask according to an embodiment.

Referring to FIG. 1 an example method includes forming a field area 12 having a trench shape to isolate separate devices on a semiconductor substrate, e.g., a silicon substrate 10, and then filling an insulation material, e.g., an oxide, inside the trench. Subsequently, an amorphous carbon layer (ACL) 14 may be deposited on the silicon substrate 10. The ACL 14 may be formed to have a thickness of, e.g., about 4000 Å to about 6000 Å. The ACL 14 may be formed directly on the silicon substrate 10.

A hard mask layer 16 may be deposited on the ACL 14. In the deposition of hard mask layer 16, SiON or SiN or $SiO_2$, etc., may be used. The hard mask layer 16 is formed to have a thickness of, e.g., about 200 Å to about 1000 Å. The hard mask layer 16 may be formed directly on the ACL 14.

A photoresist pattern 18 may be formed, e.g., through an exposure and developing process, after covering the hard mask layer 16 with a photoresist. The photoresist pattern 18 may be formed on the hard mask layer 16 with openings corresponding to a predetermined upper part of the field area 12.

Figure 2:
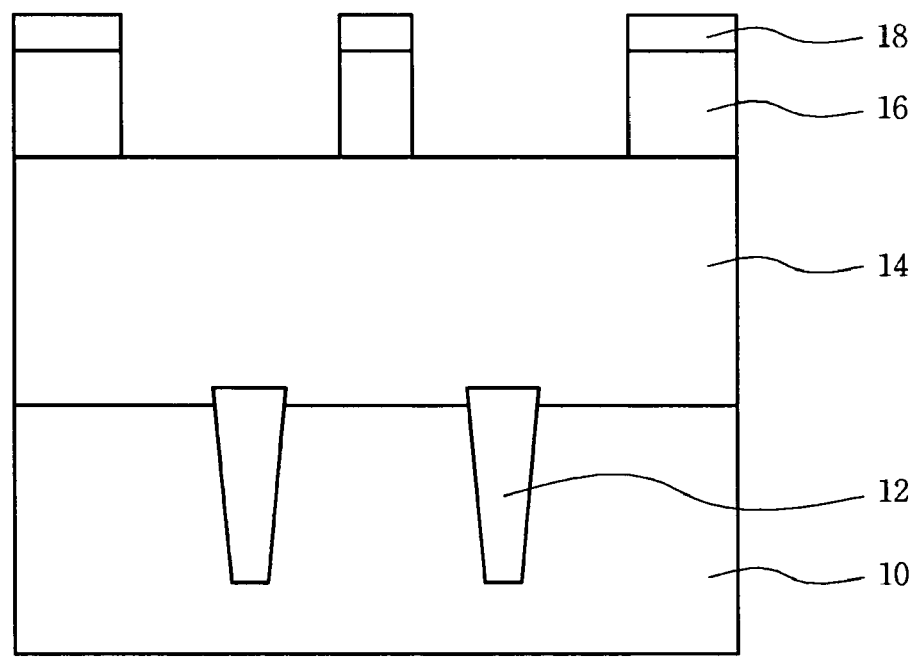

Referring to FIG. 2, the hard mask layer 16 may be etched to expose the ACL 14 through an etching process, with the photoresist pattern 18 serving as an etching mask during etching of the hard mask layer 16.

Figure 3:
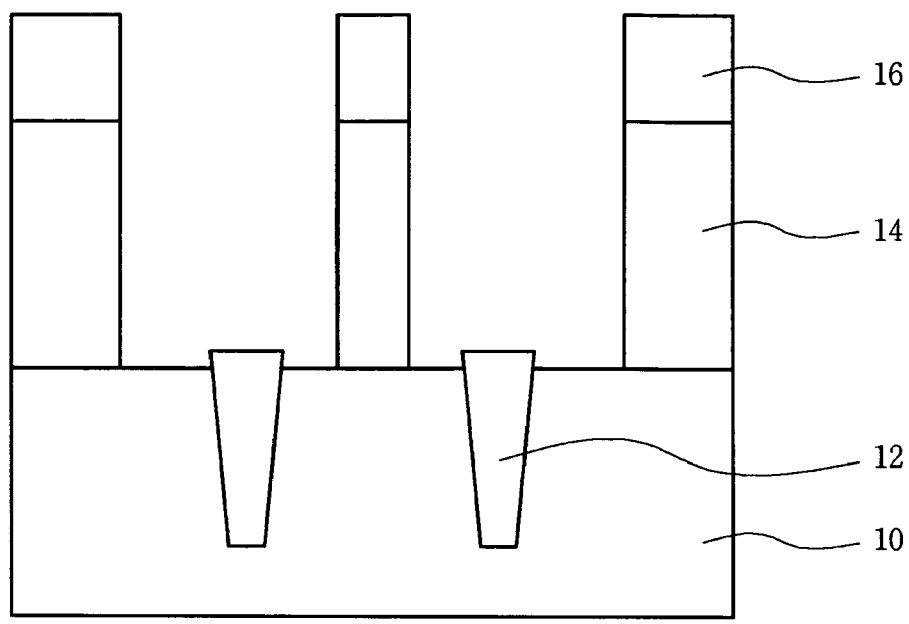

Referring to FIG. 3, the photoresist pattern 18 formed on the hard mask layer 16 may be removed. The ACL 14 may then be etched to expose the silicon substrate 10 by performing an etching process using the patterned hard mask layer 16 as an etching mask. At this time, in the hard mask layer 16, a layer material having an etching selection ratio of 1:1 or more, i.e., SiON or SiN or $SiO_2$, may be used in etching the ACL 14. When etching the ACL 14, the etching gas may be at least one of $O_2$, Ar, $N_2$, and HBr.

Figure 4:
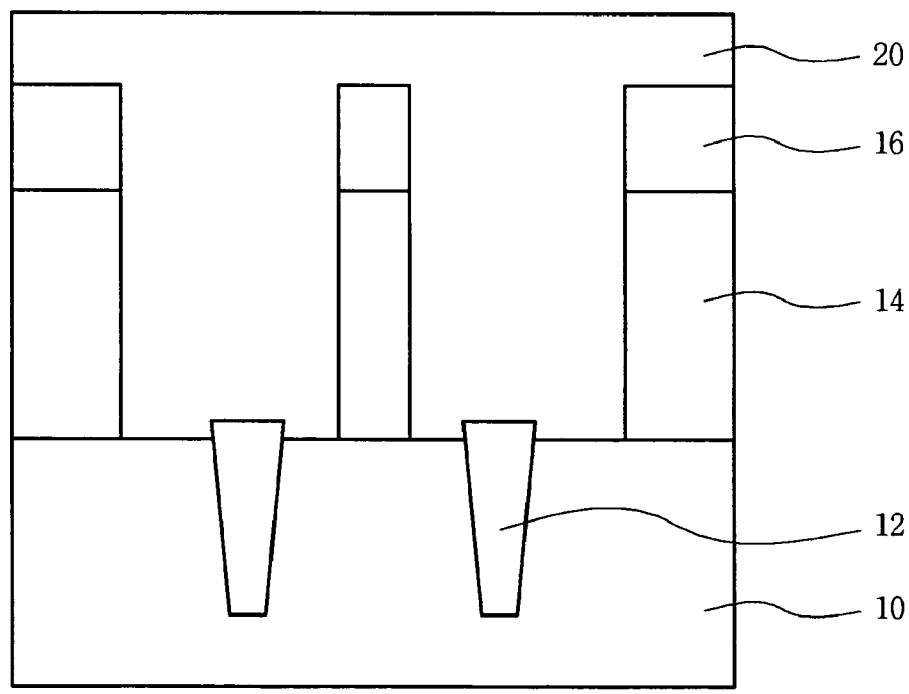

Next, an ion implantation into the field area 12 of the exposed silicon substrate 10 may be performed. Referring to FIG. 4, after the ion implantation, an organic layer 20 may be filled in a space where the pattern of the hard mask layer 16 and the ACL 14 has been formed, e.g., using a coating process. The organic layer 20 may be formed of material that can be etched by $O_2$ gas, e.g., a photoresist. Preferably, the thickness of organic layer 20 is coated thick enough so that the underlying pattern is not shown, i.e., having a thickness corresponding to or greater than the combined thicknesses of the ACL layer 14 and the hard mask layer 16. The organic layer 20 protects a field area when the hard mask layer 16 is removed.

Figure 5:
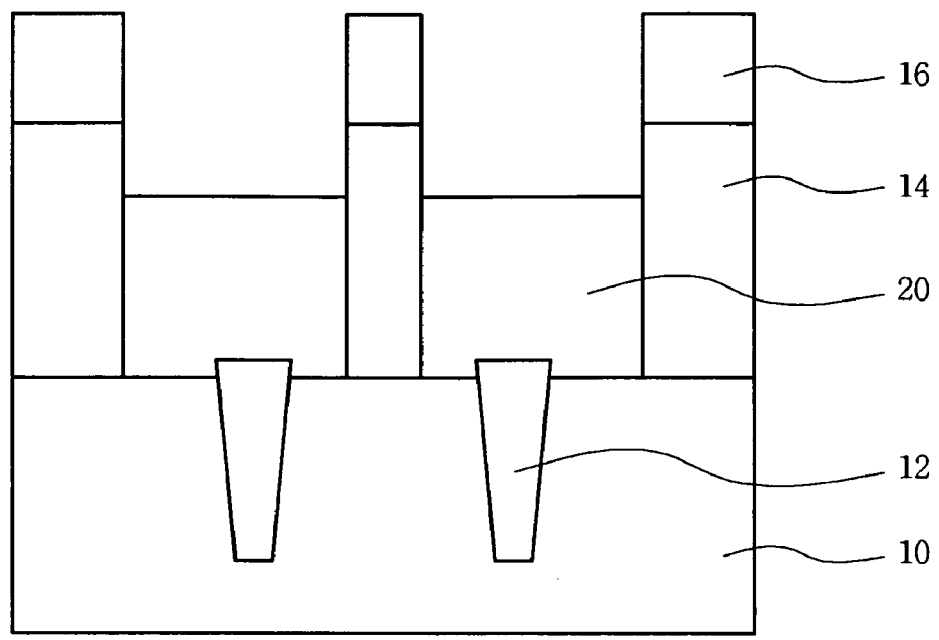

Referring to FIG. 5, the organic layer 20 may be etched back to become lower than a thickness of the ACL 14 through an etchback process using $O_2$ gas. In etching back the organic layer 20, a start time point of the hard mask layer 16 may be clarified through an end point detection (EPD).

Figure 6:
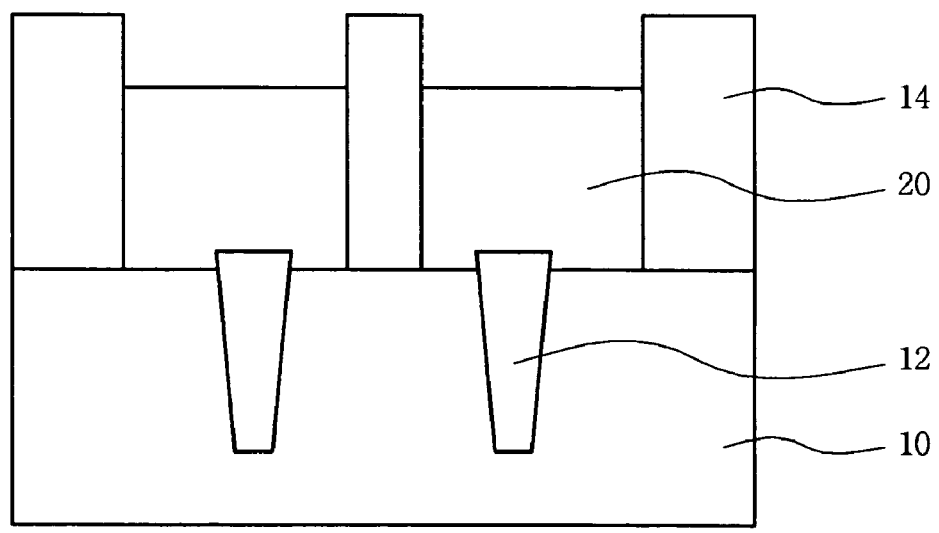

Referring to FIG. 6, the hard mask layer 16 may be removed through an etchback process. As an etch target of the hard mask layer 16, the etchback process may be performed corresponding to a thickness of hard mask layer 16 or more, so that the hard mask layer 16 does not remain.

The etchback process conditions may include a power of about 200 W to about 300 W applied at a low pressure of about 15 mTorr to about 50 mTorr, and Ar, He and a small amount of $O_2$ gas may be applied with a flow of about 100 sccm to about 200 sccm.

Figure 7:
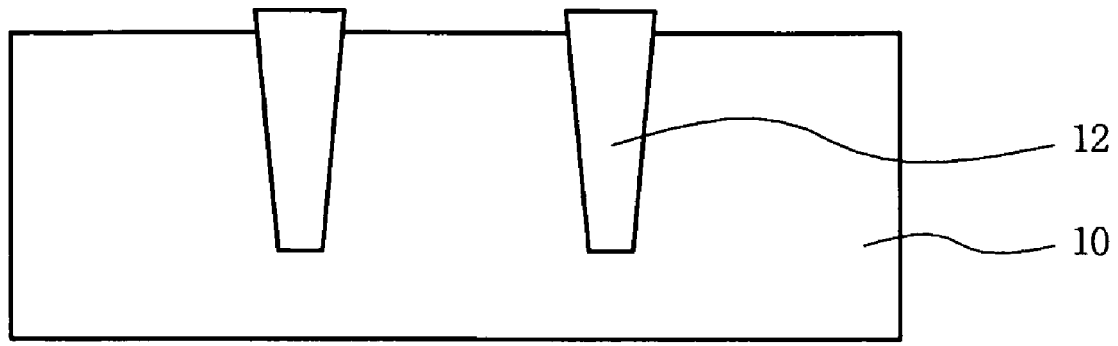

Referring to FIG. 7, ashing and strip processes may be performed such that the ACL 14 and the organic layer 20 are removed, and polymer generated at this time may be eliminated. The conditions of the ashing and strip processes may be, e.g., a power of about 700 W applied at a pressure of 1 Torr or more, and $O_2$ gas having a flow of about 1000 sccm to about 4000 sccm may be applied.

The ACL 14 may be adapted to prevent a pattern leaning effect and lifting effect of an ion implantation pattern. Thus, as described above according to an embodiment, photoresist pattern leaning and lifting effects caused by a high aspect ratio may be avoided by using a hard mask layer in a high-energy ion implantation process.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming an ion implantation mask, the method comprising:
   forming a field area on a semiconductor substrate;
   forming an amorphous carbon layer on the semiconductor substrate;
   forming a hard mask layer on the amorphous carbon layer;
   forming an etching mask pattern on the hard mask layer;
   etching the hard mask layer and the amorphous carbon layer to expose the field area through the etching mask pattern, wherein etching the hard mask layer and the amorphous carbon layer forms a hard mask layer pattern and an amorphous carbon layer pattern;
   performing an ion implantation into the exposed field area using the hard mask layer pattern and the amorphous carbon layer pattern as an ion implantation mask; and
   after performing the ion implantation, forming an organic layer in voids in the hard mask layer pattern and the amorphous carbon layer pattern.

2. The method as claimed in claim 1, further comprising:
   removing a portion of the organic layer from a void in the hard mask layer pattern;
   after removing the portion of the organic layer, removing at least a portion of the hard mask layer pattern; and
   after removing at least a portion of the hard mask layer pattern, exposing the field area by removing the organic layer from voids in the amorphous carbon layer pattern.

3. The method as claimed in claim 2, wherein the organic layer is a photoresist layer.

4. The method as claimed in claim 2, wherein the organic layer has a thickness equal to or greater than a combined thickness of the amorphous carbon layer pattern and the hard mask layer pattern.

5. The method as claimed in claim 2, wherein:
   etching the hard mask layer and the amorphous carbon layer to expose the field area includes performing a first etch process to remove portions of the amorphous carbon layer to form the amorphous carbon layer pattern, and
   the first etch process includes using the hard mask layer pattern as an etch mask.

6. The method as claimed in claim 5, wherein at least one of $O_2$, Ar, $N_2$, and HBr is used as an etching gas to remove the portions of the amorphous carbon layer.

7. The method as claimed in claim 4, wherein the hard mask layer includes one or more of SiON, SiN, or $SiO_2$.

8. A method of performing ion implantation, the method comprising: forming an amorphous carbon layer on a semiconductor substrate;

forming a hard mask layer on the amorphous carbon layer;
forming an etching mask pattern on the hard mask layer;
forming a hard mask layer pattern to expose the amorphous carbon layer by etching the hard mask layer using the etching mask pattern as a first etching mask;
forming an amorphous carbon layer pattern to expose the semiconductor substrate by etching the amorphous carbon layer pattern using the hard mask layer pattern as a second etching mask;
performing an ion implantation into the semiconductor substrate using the amorphous carbon layer pattern as an ion implantation mask; and
after performing the ion implantation, forming an organic layer in voids in the hard mask layer pattern and the amorphous carbon layer pattern.

9. The method as claimed in claim 8, further comprising removing the hard mask layer pattern after performing the ion implantation.

10. A method of fabricating a semiconductor device, the method comprising:

forming an amorphous carbon layer on a semiconductor substrate;
forming an etching mask pattern on the amorphous carbon layer;
forming an amorphous carbon layer pattern to expose the semiconductor substrate by etching the amorphous carbon layer pattern;
removing the etching mask pattern;
performing an ion implantation into the semiconductor substrate using the amorphous carbon layer pattern as an ion implantation mask; and
after performing the ion implantation, forming an organic layer in voids in the amorphous carbon layer pattern.

11. The method as claimed in claim 10, further comprising:
forming a hard mask layer on the amorphous carbon layer before forming the etching mask pattern; and
forming a hard mask layer pattern to expose the amorphous carbon layer using the etching mask pattern as an etching mask.

* * * * *